(12) United States Patent
Aue

(10) Patent No.: US 6,438,056 B2
(45) Date of Patent: Aug. 20, 2002

(54) METHOD AND DEVICE FOR REFRESHING THE MEMORY CONTENT OF A MEMORY CELL OF A READ-ONLY MEMORY

(75) Inventor: Axel Aue, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/750,666

(22) Filed: Dec. 29, 2000

(30) Foreign Application Priority Data

Dec. 30, 1999 (DE) .......................................... 199 64 012

(51) Int. Cl.[7] ................................................. G11C 8/00
(52) U.S. Cl. .............. 365/222; 365/185.25; 365/185.24
(58) Field of Search ........................ 365/189.01, 230.01, 365/222, 185.24, 185.25, 185.01

(56) References Cited

U.S. PATENT DOCUMENTS

| 5,479,170 A | * | 12/1995 | Cauwenberghs et al. ... 341/200 |
| 5,684,751 A | * | 11/1997 | Manning ..................... 365/222 |
| 5,835,413 A | * | 11/1998 | Hurter et al. ........... 365/185.24 |
| 6,005,824 A | * | 12/1999 | Crafts ......................... 365/233 |
| 6,269,039 B1 | * | 7/2001 | Gloessner, III et al. ..... 365/210 |

* cited by examiner

Primary Examiner—Viet Q. Nguyen
(74) Attorney, Agent, or Firm—Kenyon & Kenyon

(57) ABSTRACT

A method and a device for refreshing the memory content of at least one memory cell of a read-only memory is described. An embodiment of the present invention involves determining the instantaneous charge status of the memory cell; comparing the instantaneous charge status of the memory cell with a charge threshold (U_schw) which is greater than the reading charge (U_erh) sufficient for correct detection of the memory content of the memory cell; and raising the charge status of the memory cell if the instantaneous charge status of the memory cell is below the charge threshold (U_schw).

12 Claims, 2 Drawing Sheets

METHOD AND DEVICE FOR REFRESHING THE MEMORY CONTENT OF A MEMORY CELL OF A READ-ONLY MEMORY

FIELD OF THE INVENTION

The present invention relates to a method and a device for refreshing the memory content of at least one memory cell of a read-only memory. The present invention also relates to a digital controller for controlling and/or regulating certain functions in a motor vehicle and having a microcomputer for processing a control program stored at least partially in a read-only memory.

BACKGROUND OF THE INVENTION

A digital controller is used in a motor vehicle to control and/or regulate certain functions in the motor vehicle. In particular, controllers are used to control/regulate the internal combustion engine, the transmission, the brakes, the heating, and the air conditioning.

The controller includes a microcomputer having a microprocessor, a program memory, a variable memory and input and output circuits. The microprocessor is the central control unit and processing unit, i.e., a central processing unit (CPU). The program memory contains a sequence of commands to be processed by the microprocessor, that is, the control program. Generally, the program memory is a read-only memory because the control program must be preserved even after a failure of the operating voltage. The variables generated during the processing of the control program and needed for running the control program are stored in the variable memory. The variable memory is usually composed of a read-write memory with random access (random access memory, RAM). Communication with peripheral devices such as a data display unit, a keyboard, a mass memory, etc. can take place over the input and output circuits. For example, three bus systems are provided for communication between the microprocessor with the program memory, the data memory and the input and output circuits. The microprocessor indicates a desired memory address over an address bus. Over a control bus, the microprocessor determines whether reading or writing is to be performed. The data exchange takes place over a data bus.

Read-only memories are also denoted as ROMs. In addition to being provided as the program memory, read-only memories are also used for other functions in a microprocessor. In the normal case, read-only memories can only be read, so they are suitable for storing tables and programs. The content of the read-only memories is preserved for a finite period of time when the operating voltage is turned off. This period of time is in the range of approximately several years.

An EEPROM (electronically erasable ROM) is a special type of ROM. This component is a memory that can be programmed and erased electrically. The stored information is preserved even after the power supply is turned off.

Immediately after programming the memory cells of a read-only memory, the charge status is at a programming charge. Because of parasitic effects in the memory cell, the charge of the memory cells drops continuously starting from the programming charge during the finite period of time until it is ultimately below a reading charge. The reading charge is the charge of a memory cell necessary for the memory sense amplifier to be able to detect the correct status (programmed/erased). A drop in the charge status of memory cells below the reading charge level results in information stored in the memory cells being read incorrectly. Then, a program code cannot be executed correctly, resulting in a malfunction or even total failure of the microcomputer and thus, of the controller.

SUMMARY OF THE INVENTION

The present invention provides a method and device to aid in preventing a malfunction or failure of a microcomputer accessing a read-only memory due to data loss in a read-only memory.

The present invention provides a method that may include the following steps:
- determining the instantaneous charge status of the memory cell;
- comparing the instantaneous charge status of the memory cell with a charge threshold which is above a reading charge necessary for correct detection of the content of the memory cell; and
- increasing the charge status of the memory cell if the instantaneous charge status of the memory cell is below the charge threshold.

The charge status of the memory cell of the read-only memory is charged up to a programming charge (or an erase charge) as part of the programming or reprogramming of the memory cell. Because of parasitic effects, for example, traps in the oxides, in the memory cell, the charge status of the memory cell drops slowly over a finite period of several years starting from the programing charge/erase charge. The variation in the discharge over time may depend greatly on ambient parameters, for example, the ambient temperature, and therefore can be predicted only inadequately. Therefore, according to the present invention, the charge status of the memory cell during this period of time is compared with a charge threshold which is above the reading charge, in order to correctly detect the programming/erase state of a memory cell. When the charge status of the memory cell drops below the reading charge, data loss can occur in the memory cell. Therefore, the charge status of the memory cell is increased as soon as the instantaneous charge status of the memory cell drops below the charge threshold, that is, before data stored in the memory cell can be lost.

Through the method according to the present invention, the lifetime of the data in a read-only memory can be significantly prolonged. This is of interest in particular for those read-only memories which are part of a microcomputer of a controller for a motor vehicle, because the information stored in the read-only memory is correctly preserved even when there is a loss of charge of the memory cells due to the refresh.

The charge threshold is set so far above the reading charge that the information stored in the memory cell can still be read reliably at the charge threshold even in the worst case, e.g., at especially high temperatures.

For each memory cell, for each block having a plurality of memory cell or for each read-only memory having a plurality of blocks, the method according to the present invention determines the optimum time for raising the charge status of the memory cell. If the charge status of a memory cell has dropped below the charge threshold, the charge status of the memory cells of the block in which this memory cell can be arranged or the charge status of all the memory cells of the read-only memory can be raised. The method according to the present invention also makes it possible to take into account tolerances in manufacturing the memory cells of a read-only memory or component scattering with regard to the finite period of time for which the maintenance of charge of the memory cell is guaranteed.

The method according to the present invention can be used universally for various read-only memories. Except for a refresh circuit, no additional hardware is required in the read-only memory or in the microcomputer in order to implement this method. The refresh circuit can be integrated into the read-only memory.

According to an embodiment of the present invention, the charge status of the memory cell can be raised to the programming charge of a freshly programmed memory cell. According to this embodiment, the charge status of a memory cell whose charge status has been raised can again be above the reading charge for a finite period of time. Thus, the charge of the memory cell can be maintained for additional years.

According to another embodiment of the present invention, to increase the charge status of the memory cell, the content of the memory cell is stored temporarily in another memory cell, the memory cell is erased and the content of the additional memory cell is programmed again into the memory cell. To a certain extent, in increasing the charge status of a memory cell, the memory cell is in a way reprogrammed with its own memory content. The programming operation takes place in a conventional manner according to the related art by applying a programming voltage to the programming voltage pin of the read-only memory.

To determine the instantaneous charge status of the memory cell, a conventional margin-read method according to the related art can be used. The margin-read method can be used in programming or erasing a memory cell of an EPROM, an EEPROM or a flash memory, to determine whether a sufficiently high charge is applied to the memory cell for programming/erasing. According to another embodiment of the present invention, to determine the instantaneous charge status of the memory cell, a test voltage higher than the operating voltage can be applied to the memory cell in a test operation of the memory cell. This voltage can be checked to determine whether the charge of the memory cell is sufficient to invert the charge of a first capacitive load connected to the memory cell. According to this embodiment, the margin-read method can be used to determine whether a sufficiently high charge is applied to the memory cell to be able to detect the correct status, for example, programmed or erased, of the memory cell.

In an alternative embodiment of the present invention, to determine the instantaneous charge status of the memory cell, a check can be performed in a test operation of the memory cell with the operating voltage applied to the memory cell to determine whether the charge of the memory cell is sufficient to invert the charge of a second capacitive load which is connected to the memory cell and is greater than the first capacitive load.

Through these two alternative embodiments, a check is performed in the test operation to determine whether the charge status has dropped below the charge threshold. In the test operation, the curve of the memory cell charge status can be shifted toward a lower charge to a certain extent by the test voltage or by the greater capacitive load. If the shifted curve of the charge status drops below the reading charge; however, the actual curve of the charge status has just dropped below the charge threshold.

In normal operation of the memory cell, the operating voltage may be applied to the programming voltage pin of the read-only memory, and the first capacitor (bit line) can be connected to the memory cell. To ascertain whether the instantaneous charge status of the memory cell is below the charge threshold, the memory content can be read out of the memory cell once in normal operation and once in test operation, and the memory contents read out in both operations can then be compared.

The method according to the present invention can be carried out in blocks of a plurality of memory cells of a read-only memory, with a first checksum being formed from the memory content of all the memory cells of a block in normal operation, and a second checksum being formed in test operation from the memory cells of this block, and the two checksums being compared. If the two checksums deviate from one another, then the charge status of at least one memory cell of the block has dropped below the charge threshold, and consequently the charge status of a all memory cells of the block is raised.

According to another embodiment of the present invention, the method can be used to maintain the content of a memory cell of a read-only memory which is part of a microcomputer of a digital controller for a motor vehicle. This method according to the present invention can be carried out while the motor vehicle is being driven and/or during hunting operation of the controller. After a main switch or the ignition key of the motor vehicle has been switched off, the controller runs through a hunting operation to run down all the functions to be controlled in the motor vehicle in a controlled manner. During this hunting operation of the controller, the charge status of the memory cells of the read-only memories can also be checked and optionally increased. As an alternative, the method according to the present invention can also be carried out after turning on the controller during lead time.

The method according to the present invention may be carried out as a function of the operating time, the distance traveled and/or the number of driving cycles of the motor vehicle. A driving cycle is initiated by turning on a main switch or the ignition key and is ended by turning off the main switch or the ignition key. Since the finite period of time of several years for which it is guaranteed that a charge will be maintained for the memory cells is relatively long, it is completely sufficient to test the charge status of the memory cells at such long intervals to ensure that the memory content of the read-only memory is maintained. Likewise, the method according to the present invention can be carried out at much shorter intervals if the memory cells lose their charge much more rapidly.

To achieve this object, the device used according to the present invention employs a refresh circuit. The device according to the present invention may be an integral part of a read-only memory. The read-only memory is preferably part of a microcomputer. The microcomputer is preferably part of a digital controller for a motor vehicle.

The read-only memory can be switched between normal operation, programming operation and test operation (margin read). During programming operation, a programming voltage ($V\_pp=5$ V) is applied to the programming voltage pin. During test operation, a lower test voltage ($V\_pp$ 4 V) is applied as programming voltage to the programming voltage pin. During normal operation of the read-only memory, the operating voltage ($V\_pp=V\_cc=3.3$ V) is applied to the programming voltage pin.

Switching the read-only memory between programming operation and test operation can be accomplished, for example, with the help of a power supply circuit which is part of the read-only memory. It has a voltage divider with two series-connected resistors, with an electric semiconductor switch (transistor) arranged in parallel with one of the two resistors. The voltage divider is connected to the programming voltage at one end. The other end of the voltage divider is connected to ground. The power supply voltage applied to the programming voltage pin is picked up between the two resistors of the voltage divider. When the transistor is open, the power supply circuit operates as a voltage divider, with the lower test voltage (4 V) being applied to the programming voltage pin. However, one resistor is bridged when the transistor is closed, and the programming voltage (5 V) is applied to the programming voltage pin of the read-only memory.

Another embodiment of the present invention provides a digital controller for controlling refreshing the memory content of at least one memory cell of a read-only memory comprising a refresh circuit for carrying out the method of the present invention. According to this embodiment, the refresh device is not necessarily a part of the read-only memory, but instead it may also be part of the controller, i.e., it may be arranged outside the read-only memory.

DETAILED DESCRIPTION

Figure 1:
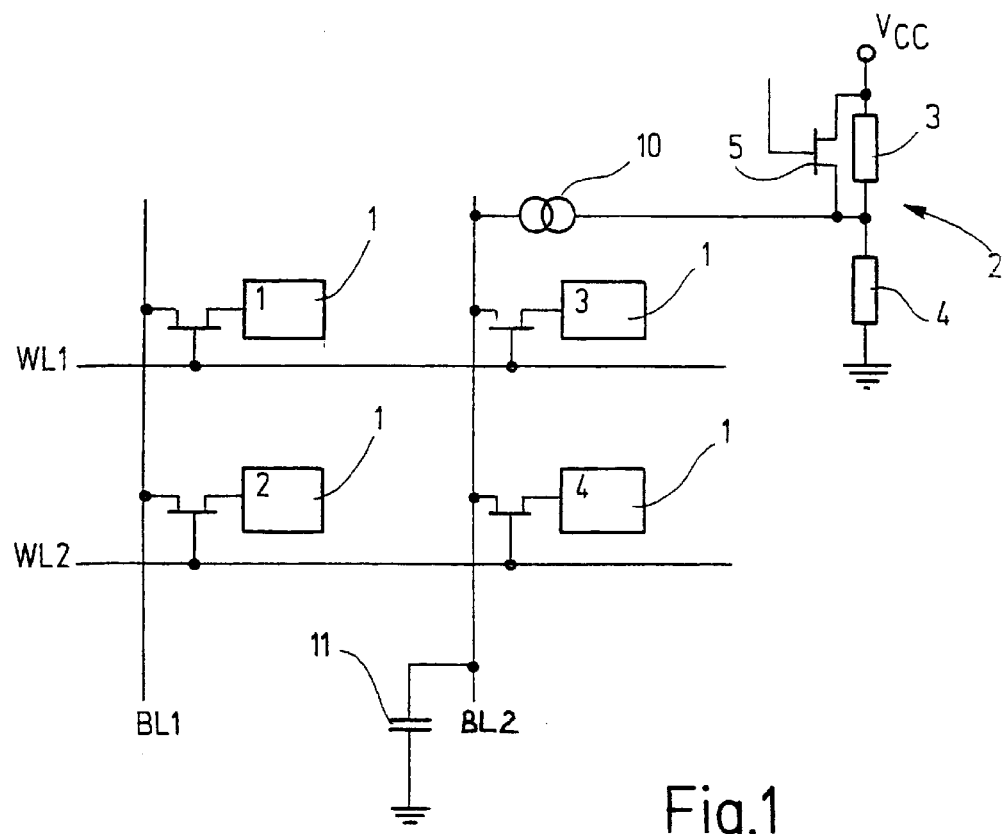
FIG. 1 shows a few memory cells of a read-only memory for carrying out the method according to an embodiment of the present invention.

FIG. 1 shows the details of a read-only memory. The read-only memory has a plurality of memory cells 1, four of which are shown in FIG. 1. For technological and circuitry reasons, individual memory cells 1 are not arranged linearly, but instead are arranged in a square matrix. A specific memory cell 1 is addressed by applying a logical one to a corresponding row line (word line, WL) or column line (bit line, BL).

A power supply circuit 2 is provided for the power supply to the programming voltage pin of memory cells 1, and it has a voltage divider having two series-connected resistors 3, 4. Resistor 3 has a resistance value of 500 Ohm, and resistor 4 has a resistance value of 2 kOhm. One end of the voltage divider is connected to programming voltage $V\_pp=5$ V, and the other end of the voltage divider is connected to ground. A transistor 5 (p-channel MOSFET) is connected in parallel to resistor 3. Voltage $V\_pp$ applied to the programming voltage pin is picked up between the two resistors 3, 4. Voltage circuit 2 may be part of the read-only memory or it may be arranged outside the read-only memory as part of a microcomputer or a controller for a motor vehicle.

The read-only memory is also referred to as a ROM. It may be, for example, a programmable read-only memory (PROM), an erasable programmable read-only memory (EPROM), an electrically erasable read-only memory (EEPROM) or a flash memory, e.g., a flash EEPROM. Read-only memories are normally only read. When the operating voltage is turned off, the memory content of memory cells 1 of a read-only memory is usually preserved for a finite period of several years.

Figure 2:
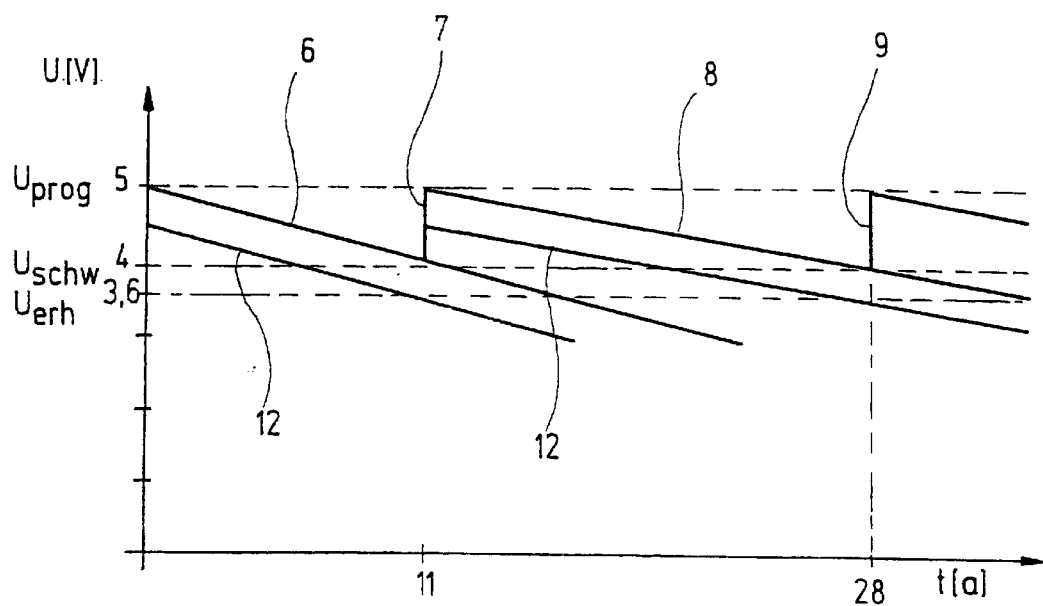
FIG. 2 shows the variation in charge status of a memory cell over time according to the embodiment shown in FIG. 1.

FIG. 2 shows variations 6 in charge status 6 of a memory cell 1 from FIG. 1. Immediately after programming memory cell 1, the charge of memory cell 1 is at a programming charge $U\_prog$ (5 V). The charge of memory cell 1 drops continuously over a finite period of time, starting from programming voltage $U\_prog$, because of parasitic effects until the voltage ultimately falls below a reading charge $U\_erh$ (3.6 V). The reading charge $U\_erh$ is the charge of a memory cell which is necessary for a memory sense amplifier to be able to detect the correct status (programmed/erased) of the memory cell. When the charge status of memory cells 1 drops below this reading charge, this means that information stored in memory cells 1 will be read incorrectly and a program code cannot be executed correctly. The method according to the present invention is proposed in order to prevent a malfunction or total failure of the read-only memory or the microcomputer accessing the read-only memory.

In the method according to the present invention, charge status 6 of memory cell 1 is checked from time to time by comparing instantaneous charge status 6 of memory cell 1 with a charge threshold $U\_schw$ (4 V) which is above the reading charge $U\_erh$. In the embodiment in FIG. 2, charge status 6 of memory cell 1 drops below the charge threshold $U\_schw$ after 11 years. Then, the charge status of memory cell 1 is raised. This procedure is labeled as 7 in FIG. 2. The charge status of memory cell 1 is raised to programming charge U prog of a newly programmed memory cell.

After raising 7 the charge status of memory cell 1, the content of memory cell 1 is maintained again for a finite period of time when the operating voltage $V\_cc$ is turned off. In the case of the present embodiment, the charge status drops continuously to a level below the charge threshold $U\_schw$ over a period of 17 years, for example. This discharging operation is labeled as 8 in FIG. 2. After dropping below the charge threshold $U\_schw$ again, the charge status of memory cell 1 is raised again, as labeled 9 in FIG. 2.

Thus, the method according to the present invention ensures that the content of a memory cell 1 will remain reliably preserved even for a longer period of time. Thus, a failure of the read-only memory or a microcomputer accessing the read-only memory due to a loss of data in the read-only memory can be prevented. With the help of the method according to the present invention, the lifetime of data stored in a read-only memory can be increased to a multiple of the usual lifetime. To reliably prevent data loss by the read-only memory, the charge status of memory cells 1 is raised not only after falling below the reading charge $U\_erh$, but is already raised as soon as it falls below the charge threshold $U\_schw$.

With the help of power supply circuit 2, the read-only memory can be switched between programming operation and test operation (margin read). In normal operation, operating voltage $V\_cc$ ($V\_pp=3.3$ V) is applied to programming voltage pin. In programming operation, the programming voltage ($V\_pp=5$ V) is applied to the programming voltage pin. In test operation, a lower test voltage (4 V) is applied. For switching the power supply voltage, transistor 5 is switched between a blocked position (programming operation) and a through position (test operation).

In test operation, power supply circuit 2 functions as a voltage divider and instead of the programming voltage, the lower test voltage is applied to memory cells 1 by way of the programming voltage pin. A current source 10 supplies an impressed current to memory cells of the read-only memory. To activate the third memory cell 1, for example, a logical one is applied to word line WL1 and to bit line BL2. Then the margin read is activated and thus memory cell 1 must be able to carry more current than would be the case in a normal read access. The current is an equivalent for the charge on memory cell 1.

A check is performed on the basis of the test voltage and the impressed current of current source 10 to determine whether the charge status of memory cell 1 is below the charge threshold U_schw. As an alternative, this can also be checked by applying the operating voltage V_cc to memory cell 1 and then checking to determine whether the charge of memory cell 1 is sufficient to invert a larger capacitive load than capacitive load 11, connected to memory cell 1.

The curve of the charge status of memory cell 1 at the test voltage, which is greater than operating voltage V_cc, or at a capacitive load which is greater than capacitive load 11, is labeled as 12 in FIG. 2. As soon as curve 12 in the charge status is below a certain voltage U_erh (3.6 V), charge status 6 or charge status 8 of memory cell 1 is raised. Due to the greater test voltage or due to the greater capacitive load on variation 12 of the charge status, curve 6 or curve 8 of the charge status of memory cell 1 is shifted toward a lower charge status. Therefore, charge status 6 or 8 of a memory cell can be raised even when the charge status has not yet dropped below the reading charge U_erh in the worst case.

Figure 3:
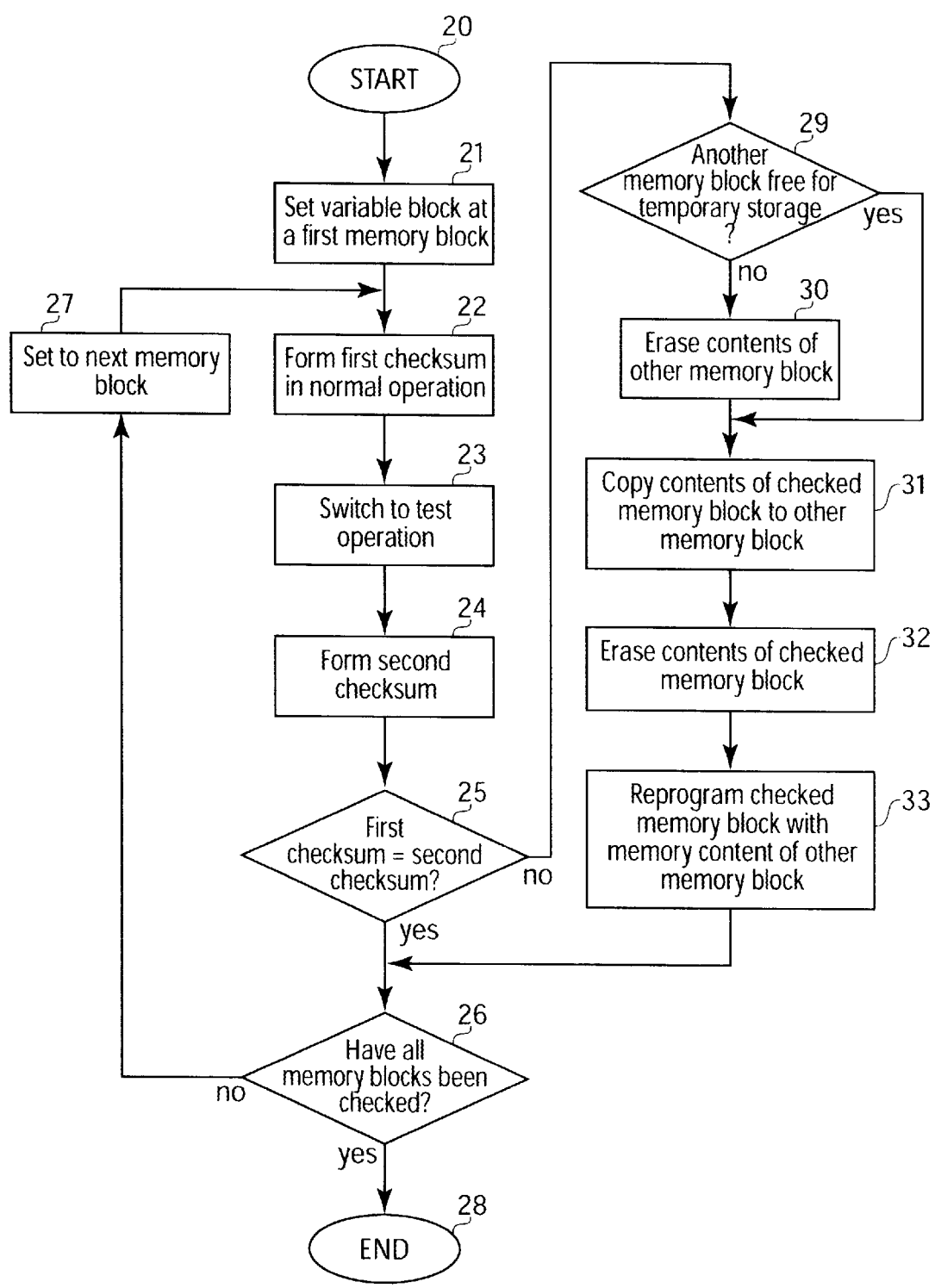
FIG. 3 shows a flow chart of a method according to another embodiment of the present invention.

FIG. 3 illustrates a flow charts of the method according to the present invention. This method is used to maintain the content of memory cells of a read-only memory. The read-only memory is part of a microcomputer of a digital controller for a motor vehicle. This controller controls or regulates various functions of a motor vehicle. This method can be carried out, for example, during driving operation of a motor vehicle, but the method illustrated in FIG. 3 is carried out during the hunting or query operation of the controller.

This procedure begins in function block 20. Then, in function block 21, a variable BLOCK is set at a first memory block composed of a plurality of memory cells 1 of the read-only memory. In a function block 22, a first checksum is formed from the memory content of all memory cells 1 of the memory block in normal operation (operating voltage V_pp=3.3 V) of the read-only memory. In a function block 23, the read-only memory is switched to test operation, i.e., the test voltage (V_pp=4 V) is applied to memory cells 1 of the read-only memory by way of the programming voltage pin. Then in a function block 24 a second checksum is formed for memory cells 1 of the memory block. If charge status 6 of one of memory cells 1 of the memory block is below the charge threshold U_schw for an operating voltage V_cc applied, then charge status 12 of this memory cell will be below the reading voltage U_erh when the test voltage is applied, and a memory sense amplifier cannot detect the correct status (programmed/erased). In this case, the second checksum will differ from the first checksum.

In a query block 25, a check is performed to determine whether the first checksum is equal to the second checksum. If all memory cells 1 of the checked memory block are above the charge threshold U_schw, then the first checksum is equal to the second checksum and the routine branches off to a query block 26 where a check is performed to determine whether all the memory blocks of the read-only memory have been checked. If not, the routine branches off to a function block 27 where the variable BLOCK is set at the next memory block. Then the method according to the present invention is run through again starting with function block 22. If all the memory blocks of the read-only memory have already been checked, the routine branches off from query block 26 to the end of the method according to the present invention in function block 28.

If the query in query block 25 has shown that the first checksum is not equal to the second checksum, then charge status 6 of at least one memory cell 1 of the memory block checked is below the charge threshold U_schw. In this case, the charge statuses of all memory cells 1 of the memory block checked are raised to the programming charge U_prog (5 V) of a newly programmed memory cell. To raise the charge statuses of memory cells 1, they are programmed again with their memory content. To do so, the routine branches off from query block 25 to a query block 29, where a check is performed to determine whether another memory block with additional memory cells is free for temporary storage of the content of checked memory cells 1. If the additional memory block is not free, the contents of the memory cells of the additional memory block is erased in function block 30. The contents of memory cells 1 of the checked memory block are then copied into the memory cells of the additional memory block in a function block 31. In a function block 32, the memory cells of the checked memory block are erased. Finally, the read-only memory is switched to programming operation, and the programming voltage V_pp =5 V is applied to the programming voltage pin. In function block 33, memory cells 1 of the checked memory block are programmed again with the memory contents of the additional memory cells.

The routine branches off again from function block 33 to query block 26, and the method according to the present invention is continued as described above.

What is claimed is:

1. A method of refreshing a memory content of a first memory cell of a read-only memory, comprising:

determining an instantaneous charge status of the first memory cell;

comparing the instantaneous charge status of the first memory cell with a charge threshold, the charge threshold being greater than a reading charge which is sufficient for correct detection of the memory content of the first memory cell and being less than a programming charge of a newly programmed memory cell; and raising a charge status of the first memory cell if the instantaneous charge status of the first memory cell is below the charge threshold.

2. The method according to claim 1, further comprising the step of:

raising the charge status of the first memory cell to a programming charge of a newly programmed memory cell.

3. The method according to claim 1, wherein raising the charge status of the first memory cell includes:

storing the memory content of the first memory cell in a second memory cell;

erasing the memory content of the first memory cell; and programming a memory content of the second memory cell into the first memory cell.

4. The method according to claim 1, wherein the determining step includes:

applying a test voltage to the first memory cell in test operation, the test voltage being greater than an operating voltage being applied to the first memory cell; and after the applying step, checking to determine whether a charge of the first memory cell is sufficient to invert a charge of a first capacitive load, the first capacitive load being connected to the first memory cell.

5. The method according to claim 4, wherein the determining step includes:

after the applying step, determining whether the charge of the first memory cell is sufficient to invert a charge of a second capacitive load connected to the first memory cell, the second capacitive load being greater than the first capacitive load.

6. The method according to claim 4, further comprising:

reading the memory content of the first memory cell a first time in normal operation during which the operating voltage is applied to the first memory cell and the first capacitive load is connected to the first memory cell;

reading the memory content of the first memory cell in test operation; and comparing the memory content read the first time with the memory content read the second time.

7. The method according to claim 6, further comprising:

performing the method in blocks for a plurality of memory cells;

forming a first checksum from memory cells of one of the blocks in normal operation;

forming a second checksum from the memory cells of the one of the blocks in test operation; and comparing the first checksum to the second checksum.

8. The method according to claim 1, further comprising:

providing the read-only memory as part of a microcomputer of a digital controller for a motor vehicle.

9. The method according to claim 8, further comprising:

performing the steps of determining, comparing and raising while one of: i) the motor vehicle is being driven, and ii) during a query operation of the digital controller.

10. The method according to claim 9, further comprising:

performing the steps of determining, comparing and raising as a function of at least one of: i) operating time, ii) distance traveled and iii) a number of operating cycles of the motor vehicle.

11. A device for refreshing the memory content of a memory cell, comprising:

a memory cell;

a read-only memory including the memory cell; and a circuit coupled to the read-only memory, the circuit configured to: i) determine an instantaneous charge status of the memory cell, ii) compare the instantaneous charge status of the memory cell with a charge threshold, the charge threshold being greater than a reading charge sufficient for correct detection of the memory content of the memory cell and being less than a programming charge of a newly programmed memory cell, and iii) raise a charge status of the memory cell if the instantaneous charge status of the memory cell is below the charge threshold.

12. A digital controller for at least one of controlling and regulating functions in a motor vehicle, comprising:

a microcomputer;

a read-only memory storing at least a portion of a control program, the microcomputer configured to process the control program; and a circuit coupled to the read-only memory, the circuit configured to: i) determine an instantaneous charge status of the first memory cell, ii) compare the instantaneous charge status of the memory cell with a charge threshold, the charge threshold being greater than a reading charge sufficient for correct detection of the memory content of the memory cell and being less than a programming charge of a newly programmed memory cell, and iii) raising a charge status of the memory cell if the instantaneous charge status of the memory cell is below the charge threshold.

* * * * *